(12) United States Patent
Vesborg

(10) Patent No.: US 9,570,650 B2
(45) Date of Patent: Feb. 14, 2017

(54) COLLAPSIBLE PHOTOVOLTAIC MODULE FOR A LARGE-SCALE SOLAR POWER PLANT

(75) Inventor: Peter Christian Kjærgaard Vesborg, Gentofte (DK)

(73) Assignee: Suntube Holding ApS, Charlottenlund (DK)

(*) Notice: Subject to any disclaimer, the term of this patent is extended or adjusted under 35 U.S.C. 154(b) by 0 days.

(21) Appl. No.: 14/343,091

(22) PCT Filed: Sep. 6, 2012

(86) PCT No.: PCT/DK2012/000098
§ 371 (c)(1),
(2), (4) Date: Mar. 6, 2014

(87) PCT Pub. No.: WO2013/034155
PCT Pub. Date: Mar. 14, 2013

(65) Prior Publication Data
US 2014/0238464 A1   Aug. 28, 2014

(30) Foreign Application Priority Data
Sep. 6, 2011  (DK) .......................... PA 2011-00675

(51) Int. Cl.
*H02N 6/00*   (2006.01)
*H01L 31/042*   (2014.01)
(Continued)

(52) U.S. Cl.
CPC ............ *H01L 31/18* (2013.01); *H02S 20/00* (2013.01); *H02S 20/10* (2014.12); *H02S 30/20* (2014.12); *Y02E 10/52* (2013.01); *Y10T 29/49355* (2015.01)

(58) Field of Classification Search
CPC .................................................... H02S 30/20
(Continued)

(56) References Cited

U.S. PATENT DOCUMENTS 4,713,492 A   12/1987  Hanak
6,259,016 B1*  7/2001  Negami et al. ............... 136/265
(Continued)

FOREIGN PATENT DOCUMENTS

DE   19857174   6/2000
DE    2088387   8/2009
(Continued)

*Primary Examiner* — Eli Mekhlin
(74) *Attorney, Agent, or Firm* — Peter A. Nieves; Sheehan Phinney Bass & Green PA

(57) ABSTRACT

An elongate photovoltaic (PV) module for use in a solar energy conversion plant for the production of electricity from incident light, the PV-module comprising a top portion with a support panel (G) carrying on a front side a plurality of electrically connected PV cells (D), and a transparent protective layer (A) sealed to the support panel (G) so as to encapsulate the PV-cells (D) between the support panel (G) and the protective layer (A), wherein prior to installation of the PV-module at the deployment site a collapsible portion of the PV-module is configured to be collapsible in a longitudinal direction by folding and/or rolling, wherein the collapsible portion includes at least the top portion, wherein the PV-module further comprises one or more integrated ballast chambers (I) in a bottom portion of the PV-module arranged on a rear side of the support panel (G), wherein said integrated ballast chamber (I) after installation of the PV-module at the deployment site contains an amount of a ballasting material (H) with a weight sufficient to immobilize the PV-module on a supporting surface of the deployment site under predetermined characteristic climate conditions for the deployment site.

19 Claims, 6 Drawing Sheets

(51) Int. Cl.
    *H01L 31/18*       (2006.01)
    *H02S 30/20*       (2014.01)
    *H02S 20/10*       (2014.01)

(58) Field of Classification Search
    USPC ........................................................ 136/245
    See application file for complete search history.

(56) References Cited

U.S. PATENT DOCUMENTS

| | | | |
|---|---|---|---|
| 6,295,818 B1 * | 10/2001 | Ansley et al. ................ 60/641.8 |
| 2001/0054252 A1 | 12/2001 | Kleinwachter | |
| 2002/0016016 A1 * | 2/2002 | Tsuzuki .......... H01L 31/022425 |
| | | | 438/57 |
| 2005/0227389 A1 * | 10/2005 | Bhattacharya ...... H01L 51/0097 |
| | | | 438/22 |
| 2009/0114262 A1 | 5/2009 | Adriani et al. | |
| 2010/0237703 A1 * | 9/2010 | Stern ................................ 307/77 |
| 2011/0048527 A1 * | 3/2011 | Irizarry ................. B22F 1/0059 |
| | | | 136/256 |

FOREIGN PATENT DOCUMENTS

| | | | | |
|---|---|---|---|---|
| DE | 102009052442 A1 * | 5/2011 | ............. F24J 2/5262 |
| DE | 102009052552 | 5/2011 | |

* cited by examiner (a)            (b)

COLLAPSIBLE PHOTOVOLTAIC MODULE FOR A LARGE-SCALE SOLAR POWER PLANT

TECHNICAL FIELD

The invention relates to an elongate photovoltaic (PV) module for use in a solar energy conversion plant for the production of electricity from incident light, the PV-module comprising a top portion with a support panel carrying on a front side a plurality of electrically connected PV cells, and a transparent protective layer sealed to the support panel so as to encapsulate the PV cells between the support panel and the protective layer, wherein prior to installation of the PV-module at the deployment site a collapsible portion of the PV-module is configured to be collapsible in a longitudinal direction by folding and/or rolling, wherein the collapsible portion includes at least the top portion.

According to a further aspect, the invention relates to a method of installing a PV-module of the above-mentioned type.

Throughout the present application, the term 'photovoltaic' is abbreviated by the acronym 'PV'.

BACKGROUND

Solar power plants produce electric power on a large scale by collecting incident light and converting the collected light into electricity by means of a large number of PV-modules. Conventional PV-modules for electricity production may be based on many different kinds of PV-cells such as c-Si (e.g. mono-crystalline, multi-crystalline, quasimono-crystalline or "string-ribbon"), a-Si (amorphous silicon), a-Si/NC-Si (amorphous silicon/nano-crystalline silicon), a-Si/SiGe (amorphous silicon/silicon-germanium), CdTe (cadmium telluride), GIGS (copper indium gallium selenide), CIS (copper indium sulphide), but a common feature of conventional PV-modules is that they are limited in their electrical power (typically to less than 300 W) by limitations on their physical size. Typical PV-modules used in large scale installations are planar and have a frontal- and sometimes also rear face which is made from planar glass. The frontal glass is often of special low-iron (Fe) content and is typically hardened. The glass-content in these panels, which is on the order of 15-20 kg in a PV-module with a nameplate power of 200-300 W, makes them very heavy and expensive. Furthermore, such conventional glass-plate PV-modules are rigid which places a practical upper limit on their size—and therefore also places upper limits to their electrical power. PV electricity production in large installations of several megawatts (MW) typically uses such rigid modules which must be mounted manually onto metallic racking hardware in order to avoid wind-induced damage and such that the modules are fixed in a beneficial angle with respect to the sun. After mounting, the PV-modules must be connected electrically from one PV-module to the next PV-module using external connectors, which is typically also a manual process. A conventional PV power plant with a name plate power of 250 MW will therefore contain on the order of 1 million such PV-modules and an equally large number of connectors which is a source of reliability- and maintenance problems.

For these reasons, the traditional way to construct a PV power plant carries very high costs, due to high consumption of materials, such as glass in the PV-modules and steel in the racking hardware, cost of transportation to the deployment site, and the large amount of manual labour involved with the installation of the large number of small modules. As a consequence, a PV power plant carries a large capital cost in its construction. To summarize, there are two fundamental problems with traditional PV-modules. The first problem is that that they and their mounting hardware are heavy and contain large amounts of materials like glass, steel, aluminium and other structural materials compared to their electrical power. The second problem is that the individual PV-modules are limited to a very low electrical power compared to typical generators on the electrical high-voltage power grid. As a consequence, it is impractical to erect and maintain PV power plants of just a few hundred MW as they contain more than 1 million individual PV-modules. Furthermore, since conventional glass-plate PV-modules cannot be scaled up because of transportation- and handling problems these rigid PV-modules are poorly suited for large-scale PV power plants. Therefore, there is a need for a new, scalable and resource-efficient technology for making PV power plants.

The prior art discloses collapsible PV-modules, which are fully or partially flexible and may be collapsed by folding or rolling. For example, U.S. Pat. No. 4,713,492 discloses a flat, carpet-like PV-module comprised of a number of discrete, but flexible sub-modules which are hinged together. However, even though referred to as a "large area module" the PV-module disclosed in U.S. Pat. No. 4,713,492 is intended as a mobile power supply that can be stowed away after temporary use. This design is not suited for use in a large-scale solar power plant producing electricity to a power-grid.

A flexible PV-module comprising solar energy converters enclosed within an inflatable envelope is disclosed in US 2001/0054252 A1. The disclosed PV-module is configured for transmitting diffused light, while collecting directional light on the solar energy converter. The design of US 2001/0054252 A1 thus has a very sparse distribution of the actual active solar energy converters results in an ineffective utilisation of footprint which is incompatible with use in a large-scale solar power plant. Furthermore, the PV-module of US 2001/0054252 A1 is intended for integration in a building, and requires at least an additional frame structure as a support.

Another inflatable PV-module is disclosed in DE 198 57 174 A1. The disclosed PV-module is intended for floating deployment on a water surface and therefore inevitably requires a light weight structure with sufficient buoyancy to keep the PV-module afloat.

DISCLOSURE OF THE INVENTION

Object of the present invention is to provide a technology for building large-scale solar power plants overcoming the problems of the prior art as described above.

A further object of the present invention is to provide a materials-efficient and labour-efficient technology for building large-scale solar power plants.

A further object of the present invention is to provide such a materials-efficient and labour-efficient technology for building large-scale solar power plants that contributes to the long-term reliable operation of such solar power plant.

According to one aspect, the object of the invention is achieved by an elongated PV-module according to independent claim 1. According to a further aspect, the object of the invention is achieved by a method of installing an elongated PV-module according to independent claim 15. Advantageous embodiments are defined by the respective dependent claims.

According to one embodiment, an elongate PV-module for use in a solar energy conversion plant for the production of electricity from incident light comprises a top portion with a support panel carrying on a front side a plurality of electrically connected PV cells, and a transparent protective layer sealed to the support panel so as to encapsulate the PV cells between the support panel and the protective layer, wherein prior to installation of the PV-module at the deployment site a collapsible portion of the PV-module is configured to be collapsible in a longitudinal direction by folding and/or rolling, wherein the collapsible portion includes at least the top portion, wherein the PV-module further comprises one or more integrated ballast chambers in a bottom portion of the PV-module arranged on a rear side of the support panel, wherein said ballast chamber after installation of the PV-module at the deployment site contains an amount of a ballasting material with a weight sufficient to immobilize the PV-module on a supporting surface of the deployment site under pre-determined characteristic climate conditions for the deployment site.

'Elongate' means having a dimension, which in a longitudinal direction is larger than in a transverse direction. 'Lengthwise' denotes a direction parallel to the longitudinal direction. 'Photovoltaic' is in the context of the present application abbreviated as 'PV'. The term 'front' refers to the side of the PV-module or the side of any part thereof that under operation faces towards the incoming light. Accordingly, the term 'rear' refers to the side of the PV-module that under operation faces away from the incoming light. 'Top' and 'bottom' are to be understood to refer to parts of the PV-module with respect to gravity, wherein the PV-module is seen in an orientation as under operational conditions. 'Vertical' directions are parallel to the direction of gravity. 'Horizontal' directions are perpendicular to the vertical direction.

A PV-module is an essentially electrically self-contained unit with a plurality of PV-cells that are grouped and readily connected to each other for collectively feeding to a common electrical interface for retrieving the electric power generated by the PV-cells contained in the PV-module. In addition to the PV-cells, the PV module thus comprises infrastructure means for retrieving the generated electricity including interconnect cables, power cables, and optional control electronics for conditioning the electrical output of the PV-module on the level of individual PV-cells, groups of PV-cells, strings, and/or on the level of the entire PV-module. Preferably, these infrastructure means are integrated and/or encapsulated in the top portion of the PV-module. Further preferably, at least some of the infrastructure means, such as electrical conductors for collecting and/or carrying power, may be configured to also provide mechanical functions, such as providing structural strength to the PV-module, thereby further reducing the weight of the collapsible portion and enhancing the reliability of the PV-module.

A PV-cell is a unit which contains a photoactive material such as silicon and which produces electricity under illumination. Typically, the PV-cells of an embodiment of a PV-module according to the invention are electrically connected to each other into long chains, hereafter called 'strings'. The PV-cells of a string may be connected in series, in parallel or a combination of both. For example, smaller groups of PV-cells operating in parallel may be connected together in series to form a string. The PV-module according to the invention contains one or more such strings of PV-cells such that the combined electrical power and the operating voltage of the module reach the desired value under solar illumination. The PV-cells and the corresponding infrastructure are sensitive to environmental influences, such as weathering, dust-ingression and the like. The PV-cells and the corresponding infrastructure are therefore encapsulated with a transparent protective layer that allows incident light in a suitable spectral range to pass and reach the PV-cells for conversion into electricity. As further detailed below, the materials for the collapsible portion are selected from light-weight, preferably at least partially flexible materials.

The intended use in a solar energy conversion plant implies that the present invention is directed to implementation in a large scale-facility with a typical total production capacity of the order of Mega-Watts and above. As mentioned above, installation costs of prior art solar power plants suffer considerably from the cost of deployment, due to e.g. the required structural support, heavy transportation, and manual labour. Furthermore, due to the large number of individual elements and interconnects in known set-ups, reliability issues arise. The present invention addresses this issue by providing PV-modules with a considerably increased name-plate power as compared to prior-art PV-modules, thereby reducing the number of PV-modules required for a given solar power plant. For the use in a large-scale solar power plant, a typical value for the desired operating voltage and output power specification ("name plate power") of a PV-module may be about 1 kV and a few kW (such as 8 kW), respectively. In order for the module to reach such high operating voltages and output power the PV-module has to include a large number of connected PV-cells. The present invention solves this problem by providing a large number of PV-cells aligned and connected together to form one or more very long strings in a highly elongated PV-module that is many meters in length, preferably above 30 m, alternatively above 40 m, alternatively above 100 m. Further preferably according to one embodiment, a highly elongated PV-module is up to 400 m, or up to 600 m. This highly elongated shape of the module poses a serious transportation and handling problem, which further according to the invention is solved by making the elongate PV-module collapsible so that it may be collapsed to a manageable size during transport.

The PV-module also comprises a bottom portion underneath the top portion, on the rear side of the support panel. The bottom portion serves to fix the module in place once the module has been deployed so that it is not moved by wind or rainwater or the like. To that end the bottom portion comprises one or more integrated ballast chambers into which a ballast material, such as sand, may be filled. The amount of ballast material required for immobilizing the PV-module on a given support surface at the deployment site may depend on the particular conditions at the deployment site. For a given deployment site, climate conditions are typically known and can be determined e.g. from an estimate, a comparison to similar sites, or according to site specific statistical data of prevalent weather and wind conditions. According to one embodiment of the present invention, the skilled person is thus instructed to consider such conditions of the deployment site and adapt the amount of ballast material accordingly to provide sufficient weight for fixing the deployed PV-module in place. In its deployed state, the PV-module thus comprises an integrated ballast chamber, which is filled with an amount of ballasting material that is sufficient for fixing the deployed PV-module in place without any need for additional mooring.

The particular combination of features of a PV-module according to the invention has several benefits for building a large-scale solar power plant.

The PV-module is elongate, but light and at least partially flexible so that it can be folded or rolled during transport. A single elongate PV-module according to the invention (with for example over 1 kW) replaces a number of the known, relatively small (typically 200-300 W), but heavy and rigid glass-plate PV-modules, thereby reducing the number of interconnects required in the solar power plant. This improves reliability and reduces manual labour cost.

The module is designed for construction from light-weight materials, where heavy materials, such as glass can be replaced by polymers and other cheap and light materials. Thereby the weight to output power specification may be reduced from about 100 g/W for traditional glass supported PV-modules to about 20 g/W or even less for a PV-module according to advantageous embodiments of the present invention. This facilitates up-scaling of the PV-modules, and saves transportation and deployment costs. This is particularly true for deployment at locations where there is plenty of space, such as desserts, plains and pampas. By making such remote, but vast spaces accessible as deployment sites for building large-scale solar power plants another benefit can further reduce cost. In such places, PV-cells that are cheaper as compared to traditional glass-plate PV-modules may be used in the PV-modules—even though perhaps the individual PV-cells are slightly less efficient.

As an important feature, the PV-module of the present invention comprises integrated ballast chambers in a bottom portion of the PV-module, thereby facilitating an easy and rapid installation/deployment of the PV-modules without the need for any additional racking hardware. The PV-module according to the invention may simply be deployed on the ground or on a groundsheet without the need for mounting structures or cast foundations—if necessary at all, a simple clearance/planarization of a given deployment site is typically sufficient. In addition thereto, the process may be automated with the help of a single module laying/deploying machine or a set of machines implementing a method for laying PV-modules according to the present invention.

However, the ballast chambers are only filled with ballast material during installation of the PV-module at the site of deployment. The ballast may be provided locally and independent of any high-technological production facility. Long distance transportation can be limited to the technologically critical parts of the PV-module, which are constructed in a light-weight design with a weight to output power ratio that is significantly reduced as compared to traditional glass-based PV-modules. The collapsible design furthermore augments the packing density expressed in terms of the sum of output power of the PV-modules that can be packed into a given volume, e.g. the total name plate power of modules which can be fitted into industry standard shipping containers for long-distance shipping. This output-power packing density can be up to four times higher than what is currently standard with traditional glass-plate modules. Thereby, more efficient shipping and thus lower shipping costs are achieved.

These benefits all contribute collectively to reducing the cost to output power ratio of the finished module and of a solar power plant constructed using elongate collapsible PV-modules.

Further, according to one embodiment, the collapsible portion comprises relatively stiff sections that are hinged together in a longitudinal direction by relatively flexible sections allowing the relatively stiff sections to be folded onto each other about a folding line oriented transverse to the longitudinal direction. In case that the one or more strings in the module are comprised of non-bendable cells, such as conventional brittle silicon photovoltaic cells, the ability of the module to fold may be achieved by making local folding-zones, where the module has low rigidity, between rigid zones where PV-cells of the one or more strings are grouped. The low rigidity folding zones may be referred to as relatively flexible sections and the rigid zones may be referred to as relatively stiff sections. The relatively stiff sections are stiff as compared to the relatively flexible sections. Furthermore, the relatively stiff sections are sufficiently stiff to avoid excessive bending moments that would cause brittle PV-cells that are arranged on the stiff sections to break.

Alternatively, the collapsible portion is configured to be rolled up onto a reel. This embodiment is preferably used for flexible PV-cells, such as PV-cells made of organic materials. However, it may also be conceived to reel a PV-module that is made of relatively stiff sections that in a longitudinal direction are hinged together by relatively flexible sections, wherein the relatively stiff sections are dimensioned sufficiently short as compared to the circumference of the reel, so as to avoid excessive bending of brittle PV-cells carried by the relatively stiff sections of the support panel layer.

The relatively stiff section may further be provided with upwardly and/or downwardly extending projections on the support panel layer for protecting the PV-cells supported on the support layer from excessive bending when reeling the PV-module.

Further, according to an alternative embodiment, the collapsible portion also comprises the bottom portion. This embodiment has the advantage that the bottom portion and the top portion are integrally formed and delivered together to the deployment site in a collapsed state. The top portion and the bottom portion of the PV-module are thus layed out together on a supporting surface at the deployment site in one laying step, and the integrated ballast chambers are filled with ballast material through appropriate openings provided in the bottom portion. Such openings may e.g. be provided on the side of the bottom portion providing access to the one or more ballast chambers in a transverse direction. The one or more ballast chambers may also be accessible for filling from the ends of the PV-module in a longitudinal direction.

Advantageously according to an alternative embodiment, the bottom portion may be provided separate from the collapsible top portion, wherein the separate bottom portion comprises openings configured for loading the one or more ballast chambers provided in the bottom portion with ballasting material prior to attaching the top portion to the bottom portion. Advantageously, the openings are closed after the bottom portion has been attached to the top portion. The bottom portion may e.g. be a base-rail having a base plate and upwardly projecting side-walls defining a ballast chamber in the form of a cavity which is open at the top for receiving a ballast material. The separate bottom portion is laid out on a supporting surface; and the separate bottom portion is immobilized by filling a ballast material into the one or more ballast chambers from the top; and finally the top portion is laid on top of the bottom portion and attached to it by attachment means, thereby advantageously closing the filling openings of the ballast chambers. Advantageously, the bottom portion is an extruded profile made from a cheap, durable light weight material, such as plastic or aluminium, which may be delivered and laid out in sections of suitable length compatible with available transportation means. The bottom portion may indeed be delivered separately and independent of the top portion. Advantageously, the side-walls of such a separate bottom profile comprise at their upper ends a flange portion to which the top portion may easily be attached by suitable fastening means, such as gluing, welding, screws, rivets, clamps, or the like. Further advantageously, the side-walls may have a different height so as to orient the top portion, and thus the surface of the PV-cells at a pre-determined angle $\alpha$ with the supporting surface of the deployment site.

Further, according to one embodiment, the module is configured for generating an electric power output of at least 1 kW. As mentioned above, by increasing the output power of the PV-module, the number of interconnects between PV-modules required for building a large-scale solar power plant is reduced as compared to a solar power plant built from traditional glass-based PV-modules.

Further, according to one embodiment, the PV-module in its deployed state is at least 30 m long and less than about 2 m wide. As mentioned above, the highly elongate collapsible design of the PV-module allows for efficient transportation of the core technological components and an automated installation at the deployment site, thereby reducing cost and increasing reliability of the installed PV-modules.

Advantageously according to one embodiment, the PV-module is elongate with a width to length aspect ratio of at least 1:20, preferably at least 1:200, or at least 1:2000, or even above. Thereby automation of the laying out of the PV-module at a deployment site is facilitated and an enhanced cost-saving effect for the installation is achieved. The laying out of the PV-module thus resembles "un-reeling" the PV-module from a transportation/storage magazine, wherein the term 'unreeling' is to be understood broadly to include a section-wise unfolding of the collapsible portion of the PV-module.

Advantageously according to a preferred embodiment, the transparent protective layer is made of a transparent flexible plastic film. Using transparent flexible plastic film is an advantageous example for a light weight material for the protective layer encapsulating the PV-cells. The protective layer performs at least one of the protective functions of UV-protection, weather-proofing, protection against dust-ingression, rain/snow/hail protection, corrosion protection, and similar environmental influences.

Further, according to one embodiment, the protective layer is made of a flexible transparent material, which upon installation is distended above the support panel by inflation and/or mechanical distension means so as to form a hollow space between the support panel and the protective layer. The PV-cells are thereby contained in an elongated, and optionally fully or partially inflatable, essentially tubular chamber with a hollow space formed above the PV-cells, which is covered by a protective top foil made of the flexible transparent material. The hollow space may be filled/inflated with air or another gas. In combination, the protective top foil sealed to the support panel and the hollow space formed between the protective top foil and the support panel effectively shield the PV-cells from environmental influences, such as rain, hail and other precipitation as well as dust so as to reduce or prevent degradation of the PV-cells. The protective top foil provides protection from direct hail, rain, dust and dirt, etc. while the hollow space serves as a buffer or an air-cushion over the PV-cells and corresponding infra-structure carried by the support panel, such that even big hail or other objects hitting the protective layer of the module decelerate and stop before any damage is done to the support panel and the PV-cells it contains.

Thereby a light-weight, partially inflatable PV-module for terrestrial use which can be collapsed by folding or rolling for easy transportation—even if the module is based on brittle photovoltaic cells—is achieved, wherein said PV-module has a high electrical power rating designed specifically for large-scale PV power plants. The high power rating per PV-module is facilitated by the light-weight, elongate and collapsible design of the PV-module with integrated ballast chambers that are configured for being filled with a ballasting material so as to immobilize the PV-module at the site of deployment.

Further, according to one embodiment, the hollow space is filled with a protective atmosphere, wherein the protective atmosphere is controlled at least with respect to one or more parameters selected from a group of control parameters including composition, pressure, humidity, flow rate, re-circulation rate, re-circulation fraction, and temperature. A controlled atmosphere may be maintained by filling/re-filling a gas into the hollow space and/or circulating/re-circulating a gas-through the hollow space. By maintaining a controlled atmosphere inside the hollow space, the PV-cells may be operated under controlled physical conditions, which are preferably adjusted to optimize solar energy conversion efficiency and extend operation life-time of the PV-cells. Preferably, appropriate sensor means are provided in the PV-module, said sensor means being configured for measuring/monitoring one or more of the above-mentioned control parameters of the controlled atmosphere when the PV-module is operated. The sensor means are adapted to provide a signal output to a display device, an alarm trigger and/or a control unit of the PV-module or of the solar power plant in which it is installed. Further preferably, the gas of the controlled atmosphere may actively be circulated within or through the hollow space.

Further, according to one embodiment, the bottom portion is configured to maintain the support panel at a predetermined angle $\alpha$ with the horizontal plane, so as to orient the PV-cells towards a principal direction of incidence of light. A principal direction of light incidence at a given deployment site may be determined as an average angle of angles of incidence observed over a given period of time. Alternatively the term "principal" may also be determined as an angle optimizing exploitation of incident light, e.g. a direction at which an integral amount of light energy falling onto the PV-cells over a given period of time is a maximum. Thereby the efficiency of conversion of incident light to electrical power output of a particular PV-module may be enhanced. A pre-determined angle $\alpha$ may further take into account any inclination of the supporting surface at the deployment site.

Further, according to one embodiment, the bottom portion further comprises means for adjusting the tilt angle $\alpha$. An adjustable tilt angle allows for improving the efficiency of the conversion of light incident at the deployment site by tracking variations in the direction of light incidence. Preferably, the longitudinal axis of the PV-module is oriented in a generally east-west direction and the tilt angle adjustment means are actuated so as to compensate for seasonal variations of the sun path (in a north-south direction).

Further, according to one embodiment, the adjustment means include pneumatic actuation means. This is particularly advantageous in combination with the embodiments of the present invention that already employ inflated/pressurized chambers and an active control thereof, because the pneumatic actuator may be hooked up to the existing gas/pressure control infrastructure. Advantageously the pneumatic actuation means is an inflatable and optionally expandable bladder, such as a rubber balloon, that is expanded by inflation. This embodiment is simple to implement.

Further, according to one embodiment, the PV-cells are coated with an antireflection coating and/or reflective surfaces, collimating optics and/or focussing optics are provided in the vicinity of the PV-cells for directing sunlight onto the PV-cells. Thereby the efficiency of conversion of incident light to electrical power output of a particular PV-module may be further enhanced.

Further, according to one embodiment, infrastructure means are provided for collecting, transferring and/or conditioning the electricity generated by the PV-cells for output to an output interface of the PV-module. Such infrastructure means may e.g. include electrical wires/cables/conductors/connectors, electronic components and/or control circuitry. Such infrastructure means may preferably be integrated in the collapsible portion of the PV-module. Further preferably, such infrastructure means are integrated and encapsulated in the collapsible top portion, thereby protecting the infrastructure means from environmental influences. Further preferably, the infrastructure means may also provide mechanical functions, such as adding/providing stiffening/structural strength to sections of the support panel, thereby further reducing the weight of the collapsible portion of the PV-module.

Further, according to one embodiment, the PV-module is covered by a separate sacrificial transparent protection sheet. Preferably, the sacrificial protection sheet is merely drawn/stretched/distended over the PV-module. Since the sacrificial sheet is not integrally formed with the PV-module, it may easily be replaced more frequently and at low cost. Preferably, the sacrificial sheet covers a plurality of PV-modules. The sacrificial sheet is configured to cope with harsh conditions that result in rapid degradation of the light-weight and flexible materials employed for building a solar power plant according to the present invention. Thereby, such degrading influences are kept from affecting the transparent protective layer of the PV-module, thus extending the lifetime of the PV-module and allowing for selecting a less expensive material choice for the transparent protective layer. For example, the exposure to UV may rapidly degrade a transparent foil and frequent replacement may be required. An advantageous embodiment therefore uses a sacrificial sheet for UV-protection of the PV-module.

According to a further aspect of the invention a solar power plant comprises a plurality of PV-modules according to any of the above-mentioned embodiments.

According to yet a further aspect of the invention, a method of installing a PV-module according to any of the above disclosed embodiments is provided and the same advantages and benefits are achieved as discussed in the context of the respective embodiments of the PV-module itself.

According to one embodiment, a method of installing an elongated PV-module at a deployment site for use in a large-scale solar energy conversion plant for the production of electricity is provided, wherein the PV-module comprises a top portion having a support panel carrying on a front side electrically connected PV-cells and a transparent protective layer sealed to the support panel so as to encapsulate the PV-cells between the support panel and the protective layer, wherein the PV-module in its installed state further comprises one or more integrated ballast chambers in a bottom portion of the PV-module arranged on a rear side of the support panel, and wherein the method comprises the steps of providing both the top portion and the bottom portion at the deployment site, wherein at least the top portion is provided at the deployment site as a lengthwise collapsible portion of the PV-module in a collapsed state, expanding the collapsible portion at the deployment site, and filling the one or more ballast chambers at the deployment site through one or more openings in the bottom portion with an amount of a ballasting material having a weight sufficient to fix the PV-module to the supporting surface under pre-determined characteristic climate conditions for the deployment site.

Further, according to one embodiment, the collapsible portion comprises the bottom portion attached to the rear side of the support panel such that the PV module is installed by expanding the collapsible portion directly onto the support surface, and filling the ballasting material into the one or more ballast chambers.

Further, according to one embodiment, the PV-module is installed by laying out the bottom portion on the support surface, loading the one or more ballast chambers, and expanding and attaching the collapsible top portion onto the bottom portion.

Further, according to one embodiment, the method further comprises the step of distending the protective layer above the support panel so as to form a hollow space between the protective layer and the PV-cells. Advantageously, the protective layer may be distended by inflating the hollow space with air or any suitable gas/gas mixture and/or by mechanical distension means, such as a wire bow.

Further, according to one embodiment, the method further comprises the step of maintaining a protective atmosphere within the hollow space, wherein the protective atmosphere is controlled at least with respect to one or more parameters selected from a group of control parameters including composition, pressure, humidity, flow rate, re-circulation rate, re-circulation fraction, and temperature.

Further, according to one embodiment, the method comprises orienting the longitudinal axis of the PV-module in a generally east-west direction and tilting the PV-cells about a longitudinal axis in a generally north-south direction by a tilt-angle $\alpha$.

Further, according to one embodiment, the method comprises adjusting at least a tilt angle $\alpha$ by actuating tilt angle adjustment means so as to compensate for seasonal variations of the sun path, thereby improving the efficiency of the conversion of light incident at the deployment site.

BRIEF DESCRIPTION OF THE DRAWINGS

The invention is in the following further discussed with reference to exemplifying embodiments, wherein the same reference signs refer to corresponding elements. The drawings show on FIG. 1 a cross-sectional view of an elongate PV-module according to one embodiment, FIG. 2 a cross-sectional view of an elongate PV-module according to an alternative embodiment, FIG. 3 a cross-sectional view of an elongate PV-module according to an alternative embodiment, FIG. 4 a cross-sectional view of an elongate PV-module according to an alternative embodiment, FIG. 5 a cross-sectional view of an elongate PV-module according to an alternative embodiment, FIG. 6 a cross-sectional view of an elongate PV-module according to an alternative embodiment, FIG. 7 a detail of an elongate PV-module according to one embodiment as seen from top, FIG. 8 a cross-sectional view of an elongate PV-module according to an alternative embodiment, FIG. 9 a cross-sectional view of an elongate PV-module according to an alternative embodiment, FIG. 10 a cross-sectional detail of an elongate PV-module according to an alternative embodiment, FIG. 11 a cross-sectional detail of an elongate PV-module according to an alternative embodiment, and FIG. 12 a cross-sectional view of an elongate PV-module according to an alternative embodiment.

DETAILED DESCRIPTION OF THE INVENTION

Figure 1:
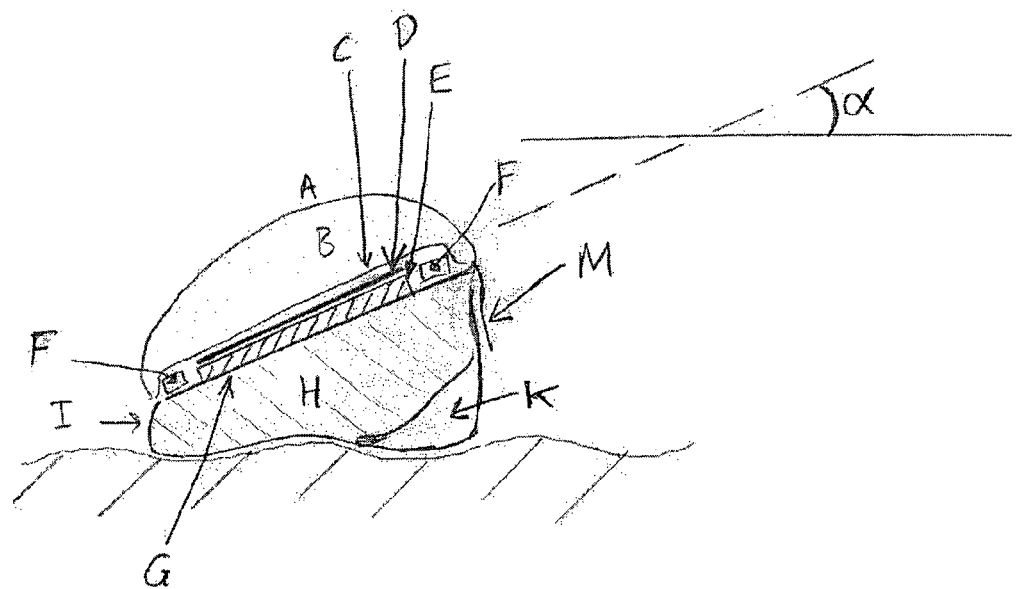

A PV-module according to the present invention is highly elongate. Typically, the PV-module is long having a length of several tens of meters, or even several hundreds of meters in a longitudinal direction, but not very wide having a width in a transverse direction of having a width of less than a few meters—typically less than a couple of meters, or about 1 m-2 m. The PV-module may be folded, for example like an ammunition belt, into a transport cassette or rolled onto a carrier for transport. The folding may be in a zigzag-, concertina-, flexagon-, or other patterns. By using flexible materials of construction for making the PV-module and providing suitable mechanical support for the individual PV-cells to avoid breakage during handling, a PV-module can be made that can be folded or rolled even if using inflexible and perhaps brittle PV-cells, such as PV-cells made from crystalline silicon. Thereby, a substantial saving in materials is achieved, while at the same time substantially increasing the output power to mass ratio of the PV-module. From geometrical and practical considerations it is estimated that such a photovoltaic module should have a length of 30 m-600 m, more advantageous 40 m-400 m) and be capable of producing a total electrical power output of at least 1 kW/peak and up to 15 kW/peak for PV-modules with a single string of PV-cells and up to n×15 kW/peak for PV-modules with a number of n strings of PV-cells.

A PV-module according to the invention integrates a combination of three basal functional parts, namely a frontal part, a central part, and an integrated substructure part as described in the following, wherein letters in parenthesis refer to the drawings:

1) The frontal part protects the PV-cells against environmental influences and transmits incident light to the PV-cells. The frontal part protects the PV-module from influences from above, such as dust, moisture, and water penetration. Furthermore, the frontal part may comprise a hollow space (B) defined in combination with the central part above the PV-cells. The hollow space (B) may be inflated to form an air-cushion protecting the module from impact of small objects, such as hail. The frontal part includes the transparent protective layer in the form of a protective top foil (A) distended above the central part, which is transparent or translucent at least within a light-wavelength range that matches the chosen type of PV-cells with respect to spectral absorption and/or spectral conversion efficiency characteristics. For typical crystalline silicon PV-cells an advantageous spectral range is between about 400 nm and about 1200 nm. The frontal part may further comprise optical means for collimating, focussing, and/or otherwise directing the incident light to the PV-cells.

2) The central part comprises the PV-cells (D), connected in one or more strings. The central part further comprises the corresponding electrical connections between the PV-cells (D). The PV-cells (D) are arranged on the front side of a support panel (G). Advantageously, the support panel (G) also minimizes penetration of humidity from below. The central part is sealed together with the frontal part to form a top portion of the PV-module comprising the electrically connected PV-cells (D), which are encapsulated between the support panel (G) of the central part and the transparent protective layer (A) of the frontal part. The central part may be made such that it is piecewise rigid along groups of PV-cells (D) in the one or more strings of the PV-module in order to provide protection from bending and other mechanical loads during handling, wherein folding zones (N) are provided in between the rigid zones at suitable intervals along the length of the PV-module, thereby allowing the PV-module to be folded or rolled for transport.

3) An integrated substructure part forming a bottom portion of the PV-module with integrated ballast chambers (I) which, when filled with ballasting material (H), via gravity serves to immobilize the entire PV-module. Furthermore, the substructure part is preferably configured to be in good contact with the central part such that the ballasting material (H) may act as a heat sink and/or reservoir so as to dampen thermal variations and avoid excessive heating of the PV-cells (D) and the support layer (G) by absorbing heat during the day, and possibly return some of the heat during the night.

Deployment of the PV-module needs little preparation of the site except removal of vegetation and larger rocks, but it is of course possible to lay the PV-module on a ground foil or base foil, such as any suitable geosynthetics, instead of laying it directly on the ground if local conditions make this more attractive. Variations of one preferred embodiment of the invention are shown in FIGS. 1-6, 8, and 9. According to this embodiment, the frontal part, the central part, and the substructure are joined together in a long continuous band thus forming the collapsible portion of the PV-module. The collapsible portion according to these embodiments thus comprises essential all core components of the PV-module including the ballast chambers (I) —apart from ballasting material (H) and possibly peripheral components (not shown). The collapsible portion is delivered to the site of deployment in its collapsed state, unreeled/expanded on a supporting surface and the ballast chambers (I) are filled with ballasting material (H) so as to form the PV-module with an integrated substructure comprising integrated ballast chambers. In its deployed state, the PV-module thus comprises an integrated ballast chamber, which is filled with an amount of ballasting material that is sufficient for fixing the deployed PV-module in place. The ballasting material may for example be at least two times the weight of the un-ballasted PV-module, typically about thirty times the weight of the un-ballasted PV-module, or preferably even at least a hundred times the weight of the un-ballasted PV-module.

The immobilization of the PV-module to prevent it from moving under the influence of wind, rain, snow or other external influences is accomplished by filling the one or more ballast chambers (I) underneath the central part with a ballast material (H) such as sand, cement, gypsum, fly ash, Dolomite, Montmorillonite or other conveniently available materials. The ballast material (H) may be mixed with pest-control agents such as pesticides or repellants to prevent plants, insects, rodents, birds or similar from invading the ballast chamber. The process of filling ballast material into the PV-module may for example be accomplished by blowing the ballast material into the PV-module carried in a stream of air via a retractable inflation tube which initially extends far into the ballast chamber from one end (or both ends) of the PV-module and which is then drawn out of the PV-module as the ballast chamber is filled up. This method is particularly suited for ballast chambers of the kind shown in FIGS. 3, 4, 5 and 6 or similar. Alternatively, filling of the ballast material may also be accomplished by means of a conveyor beak which fills the ballast material into the ballast chambers (chamber) via self-closing/sealing valve (M) ports which are suitably spaced along the length of the module. The spacing between sections to be filled with the conveyor beak should be less than 2 m (or more advantageously less than 0.5 m, or best 0.25 m). This method of filling the module with ballast is particularly relevant for ballast chambers of the type shown in FIGS. 1, 2, 8 and 9 or similar.

Figure 11:
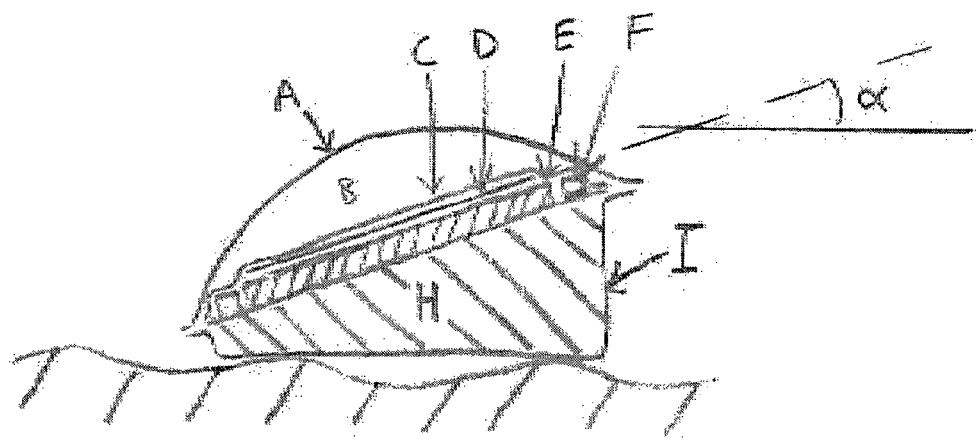

An alternative embodiment is shown in FIG. 11. According to this embodiment, the top and bottom portions may be delivered separately and joined together at the site of deployment so as to form the PV-module with an integrated substructure comprising integrated ballast chambers (I). Advantageously in this embodiment, the ballast chambers (I) defined in the bottom portion are filled with ballasting material (H) prior to attaching the top portion. It is understood that a design where top and bottom portions are joined on-site as by way of example is shown in FIG. 11 may also be combined with other advantageous features disclosed in the present application.

Once the PV-module has been laid out and ballasted, the hollow space (B) between the transparent protective layer (A) and the central part may be inflated with a gas at or above atmospheric pressure such that the transparent protective layer is distended. The inflated hollow space (B) between the support panel (G) and the protective top foil (A) forms a gas cushion over the PV-cells (D), which protects the delicate PV-cells from mechanical impact, e.g. in case the module is hit by hail. This is because the hail is decelerated and repelled by the gas cushion. This gas for inflating the hollow space (B) may advantageously be actively supplied from one or both ends of the PV-module in order to maintain a suitable pressure and optionally provide circulation of the gas. The PV-modules may be "single-open" or "double-open". In a single-open PV-module all electrical connections and connections to the gas inflation system is from one end while the other end is sealed. In a double-open PV-module the electrical connections and/or the gas inflation connections may be in one or both ends of the PV-module. One purpose of actively inflating the PV-module with gas is that this gas may be pre-dried in order to maintain a very low relative humidity inside the PV-module at all times which serves to avoid internal condensation during external temperature drops (e.g. at night-fall). Another purpose of the active control of the atmosphere inside the PV-module is to maximize convective cooling of the PV-cells since low operating temperature is often beneficial for both efficiency and longevity of the PV-cells. For double-open PV-modules it is possible to continuously blow gas through the module and for single-open modules it is possible to have an internal inflation tube which terminates at the sealed end of the PV-module and through which gas may be injected so that it flows back towards the open end through the hollow space (B). Furthermore, the gas inside the hollow space (B) may be monitored with respect to one or more control parameters. By monitoring the gas inside a PV-module, e.g. with respect to pressure and composition, any leaks may be detected so that they may be repaired before damage is caused to components of the central part such as the photovoltaic cells (D) or electrical connections (L) and other components.

When installed at the deployment site in an operational position, the central part of the PV-module is preferably tilted at an angle $\alpha$ with respect to the horizontal plane. Preferably, the PV-module is laid out with the longitudinal axis oriented essentially in the east-west direction in order to optimize the orientation of the photovoltaic cells with respect to the sun. Further preferably, the support panel (G) and consequently the PV-cells (D) are thus tilted in a north-south direction at a tilt angle $\alpha$ with respect to the horizontal plane, which is determined by the latitude of the deployment site so as to optimize the orientation of the PV-cells (D) with respect to the sun. Typical tilt-angles vary between 15 degrees and 35 degrees in most parts of the world.

Figure 12:
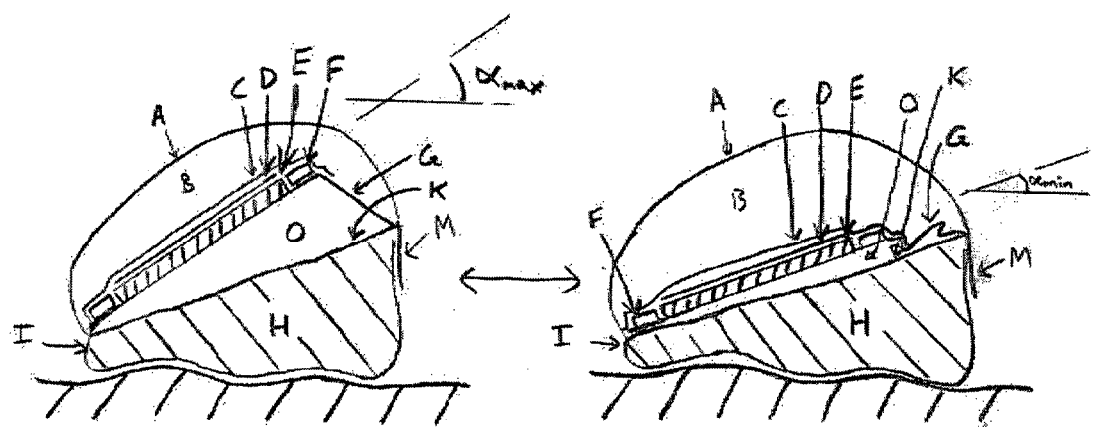

According to one advantageous embodiment, means for adjusting the tilt-angle $\alpha$ are provided so as to track seasonal variations of the sun path. Such an embodiment is shown in FIG. 12. Preferably, the adjustment means are integrated in the bottom portion of the PV-modules and may advantageously include pneumatic actuation, e.g. in the form of an expandable bladder or inflatable chamber (O) provided underneath the support panel allowing to vary the position of one of the transverse edges, whereas the opposite edge is hinged. The tilt angle $\alpha$ may thus be adjusted between a first, minimum tilt angle $\alpha\_min$, where the bladder is deflated, and a second, maximum tilt angle $\alpha\_max$, where the bladder is fully inflated, simply by adjusting the pressure in the bladder. The support panel may be biased towards the minimum tilt angle $\alpha\_min$ by its own weight or by appropriate elastic biasing means, such as a spring loading, wherein the pneumatic adjustment towards increased tilt angles is performed against this bias.

FIG. 1 shows a cross-sectional view of one embodiment of a PV-module placed on a support surface of a deployment site. The PV-module comprises a protective top foil (A) sealed to a support panel (G) carrying a single string of PC-cells (D) that are grouped on top of respective reinforcing substrates (E). On the front side, the support panel (G) further comprises longitudinal stiffeners (F) embracing the individual substrates (E) and providing a section wise stiffening reinforcement to the support panel (G). The PV-cells (D) are preferably covered by an additional top sheet (C) that is laminated or otherwise applied to the front side of the PV-cells (D) in a sealing manner. The top sheet (C) may be configured to minimize reflection of light and to provide further support of the PV-cells (D). Materials and methods for applying a top sheet (C) are known to someone skilled in the art. The protective top foil (A) is distended above the support panel (G), e.g. by inflation with a controlled gas atmosphere, so as to provide a hollow space (B) that may act as a shock protection. On the rear side of the support panel the PV-module comprises a bottom portion made of a flexible material. The bottom portion comprises an integrated ballast chamber (I) configured and shaped to support the support panel (G) at a tilt angle ($\alpha$) with respect to the horizontal plane, such that the photosensitive top face of the PV-cells (D) is inclined towards the principal direction of incoming light. The distended shape of the ballast chamber (I) is achieved by filling the ballast chamber (I) with a ballast material (H) through a filling port (M), such as a self-sealing valve flap providing an opening through the sidewall of the bottom portion to the integrated ballast chamber (I). The distended shape of the ballast chamber (I) and of the bottom portion may be controlled by adequate tailoring of the flexible walls, and by providing additional shaping means, such as the internal tie (K) shown here.

Figure 2:
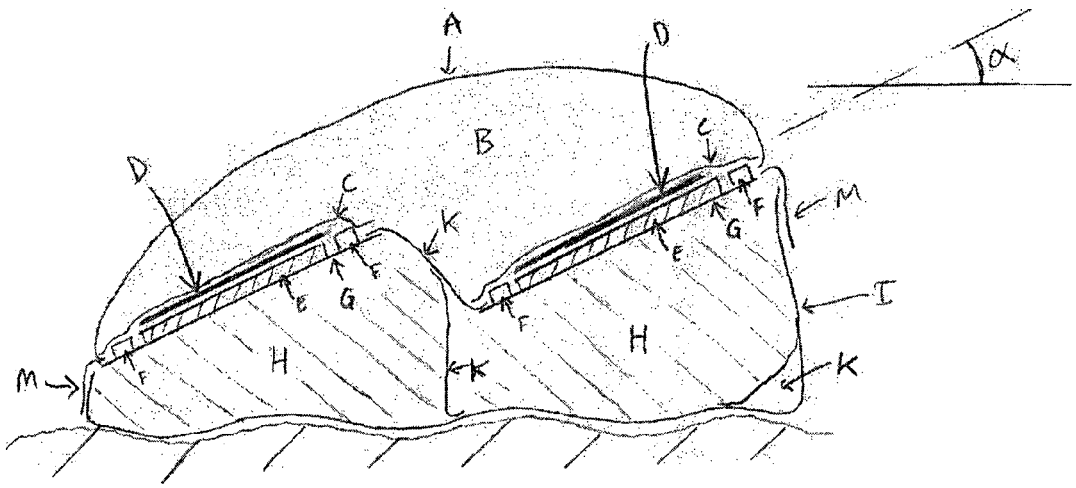

FIG. 2 shows a cross-sectional view of an embodiment corresponding to the embodiment of FIG. 1. However, two parallel strings of PV-cells (D) carried by respective substrates (E), two separate support panels (G), and supported by a combined bottom portion with two separate integrated ballast chambers that are separated by an internal wall acting as shaping tie (K). The integrated ballast chambers are fillable with ballasting material (H) through respective side ports (M). The two strings of PV-cells are encapsulated by a common protective top foil (A) sealed to the support panels (G) and defining a common hollow space (B) that may be filled with a controlled gas atmosphere.

Figure 3:
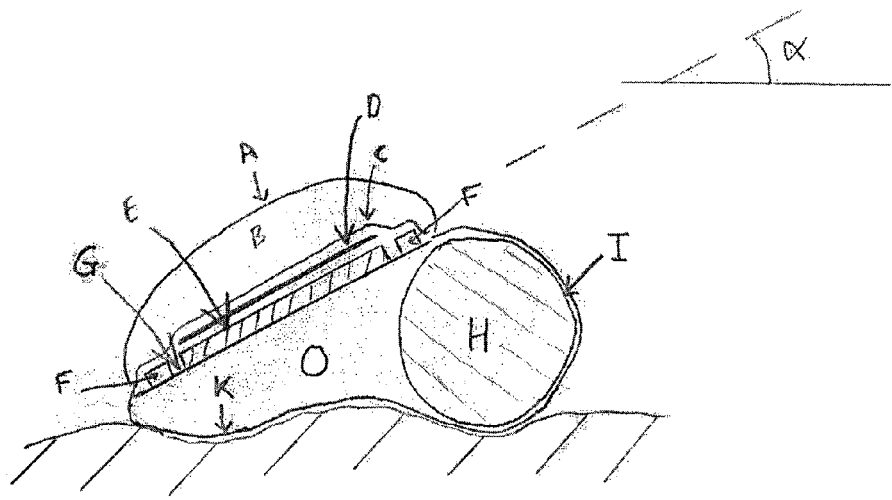

FIG. 3 shows a cross-sectional view of an embodiment with a modified bottom portion. The embodiment comprises a single string of PV-cells (D) in a top portion corresponding to that of FIG. 1. In addition to the integrated ballast chamber (I) filled with ballast material (H), the bottom portion of FIG. 3 comprises a wedge shaped inflatable chamber (O). The shape of the inflatable chamber (O) is determined by the tie foil (K) and the shape of the internal ballast chamber (I). The tilt angle $\alpha$ is essentially determined by the height of the filled internal ballast chamber (I).

Figure 4:
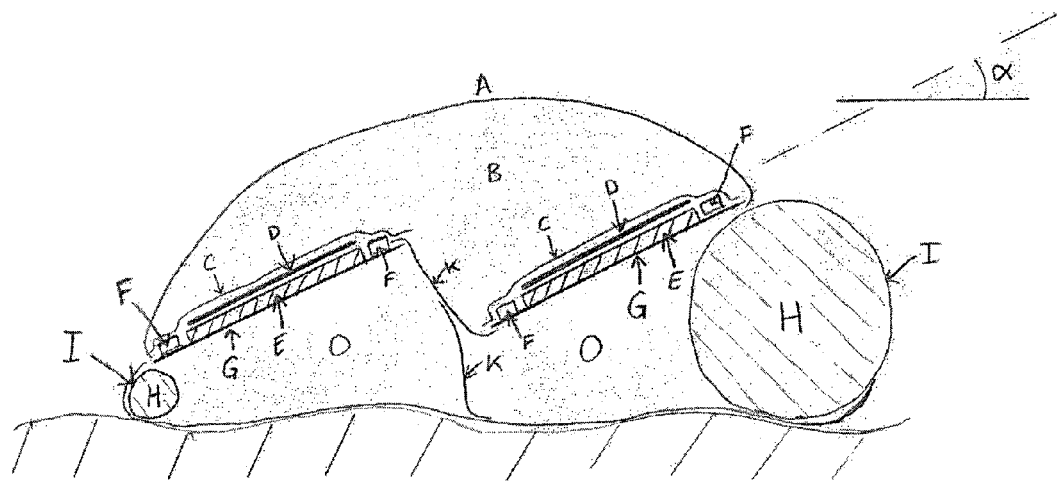

FIG. 4 shows a cross-sectional view of a variation of the embodiment of FIG. 3 with two strings of PV-cells carried by respective substrates (E) and support panels (G). The PV-module is immobilised on a supporting surface of the deployment site with ballasting material (H) filled into ballasting chambers that are arranged along the longitudinal edges of the PV-module. The orientation of the support panels (G), and thereby of the PV-cells (D), is determined by wedge-shaped inflatable chambers (O) defined by tie foils (K) in combination with side walls ballasting chambers (I). A common protective top foil (A) and hollow space (B) protects the PV-module from the top.

Figure 5:
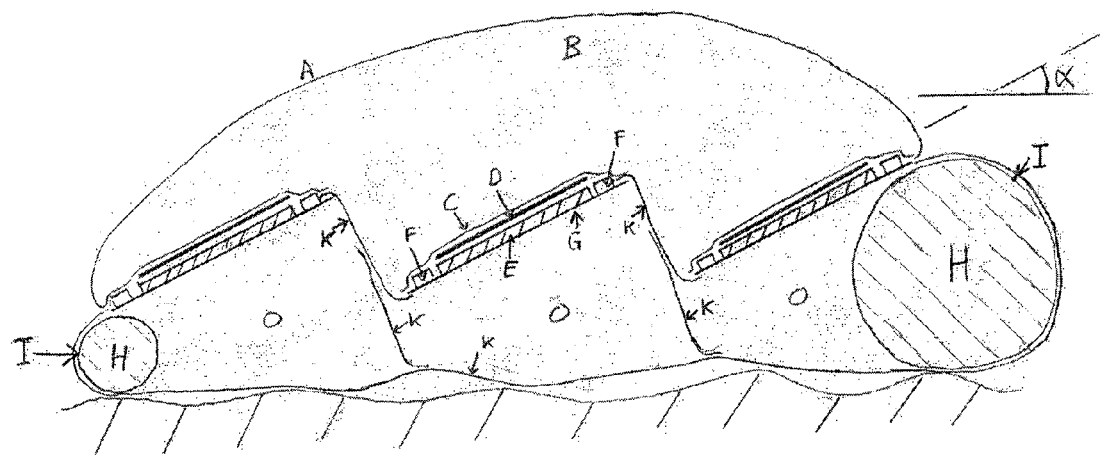

FIG. 5 shows a cross-sectional view of an analogue variation of the embodiment of FIG. 4, wherein three strings of PV-cells (D) are supported by a bottom portion with two edgewise arranged integrated ballast chambers (I) and three wedge-shaped inflatable chambers (O) including appropriately tailored tie foils (K).

Figure 6:
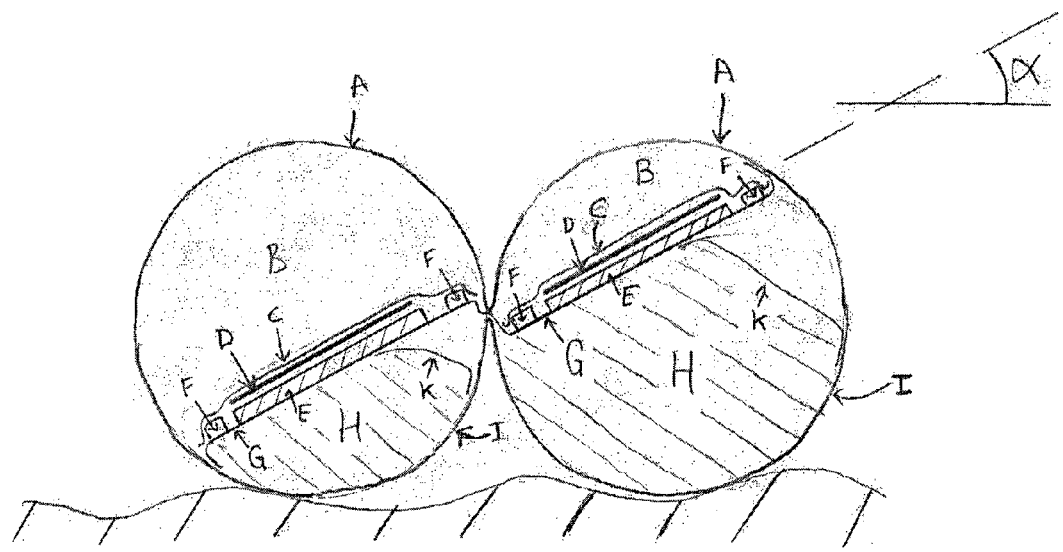

FIG. 6 shows a cross-sectional view of a module comprising two strings of PV-cells. The PV-module comprises two adjacent, longitudinally extending tubular structures of essentially circular cross-section which are connected to each other along their contact line. Each tubular structure comprises a string of PV-cells on a support panel (G) configured according to FIG. 1. Seen in cross-section, the support panels (G) intersect the circular structures along section lines separating the circles in an upper part defining the hollow space (B) enclosed by the protective top foil (A) and a lower part defining the bottom portion with integrated ballast chambers (I). This assembly is particularly stable with respect to rotation about the tilt axis, thereby reliably ensuring maintenance of a pre-determined tilt angle $\alpha$.

Figure 7:
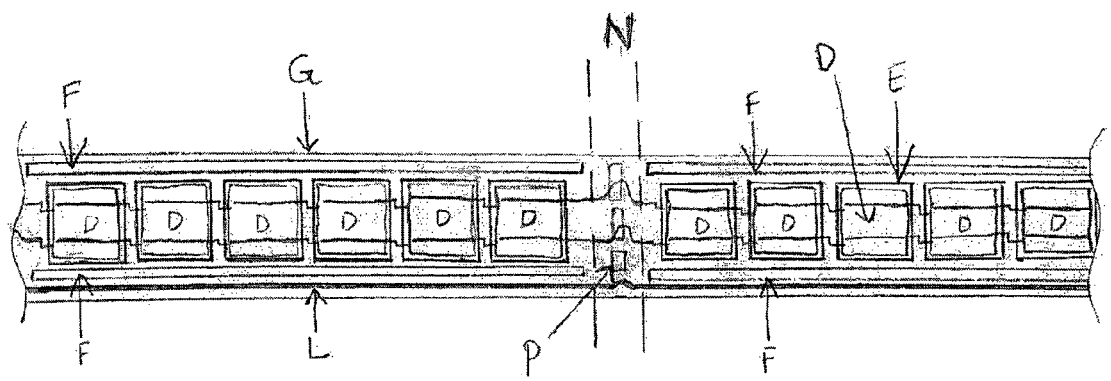

FIG. 7 shows a top view of a support panel (G) for an elongate collapsible PV-module carrying a string of PV-cells (D). The support panel forms part of the collapsible portion of a PV-module according to one embodiment of the invention. However, a top sheet (C), or collapsible protective top layer (A) sealed together with the support panel (G) at the factory prior to transportation, or a flexible/collapsible bottom portion are not shown. The central part contains one or more, typically one, two or three strings of connected PV-cells (D) placed in between the transparent protective layer (A) and the support panel (G). This central part must as a minimum protect the PV-cells from mechanical damage (particularly during transport and handling during production and deployment. The central part should also prevent or at least reduce penetration of moisture from the underlying ballast elements or substructure. It may be advantageous to integrate all electrical components such as cell-to-cell tabbing wire, bypass diodes/rectifiers, bypass cable, and where applicable one or more return cables, e.g. for PV-modules that are operated from one end only, and further where applicable signal wiring for communication with integrated sensors and other electronics. The connections of diodes and other components inside the module can be made as in traditional PV-modules according to known techniques. If the PV-module is based on inflexible or fragile/brittle PV-cells it is important that the central part be made such that the bending stiffness along the folding-zones (N) between the groups of PV-cells is substantially lower than in the stiffened sections with the PV-cells so that the PV-cells are not materially stressed during rolling or folding. To ensure that this is the case it is possible to incorporate further mechanical support (E) of the cells into the central part. As an example, this may be accomplished by supporting the PV-cells on small, stiff substrate pads (E) protecting the PV-cells (D) against undesired bending moments. Furthermore, the folding-zones (N) may for example be made using polymeric hinges (P). In case the PV-module is comprises one or more return cables or other power conducting cables these can be made so that they contribute to the section wise stiffness of the PV-modules in the regions where PV-cells are placed so that they serve a double purpose of carrying the current produced by the cells and of providing mechanical support of the cells as previously described. Accordingly, in the folding zones (N) the power conducting cables can be made locally relatively flexible as compared to the stiffened sections. If a return cable (cables) is incorporated into the module it may also provide protection in case of lightning strike to ground by limiting local voltages so as to not attract lightning. In the embodiment shown in FIG. 7, the PV-cells (D) are supported by respective substrates (E) and the support panel (G) is stiffened section wise by longitudinally arranged stiffeners (F). The support panel (G) further carries power conductors (L). The PV-cells (D) are grouped together within the stiffened sections. The sections are connected by transverse folding zones (N) along which the support panel (G) can be bend in order to collapse the collapsible portion of the PV-module for transportation. In the region of the stiffened sections the support panel (G) is relatively stiff and in the region of the folding zones (N) the support panel (G) is relatively flexible, thereby allowing the support panel (G) to be bent along transversely oriented folding lines without damaging the fragile PV-cells. The relative flexibility may be brought about e.g. by interrupting/omitting the stiffening beams (F) in the region of the folding zones (N) and/or by providing hinges of flexible polymer foils in these regions, wherein electrical connection across the folding zones (N) is ensured by flexible conductors.

Figure 8:
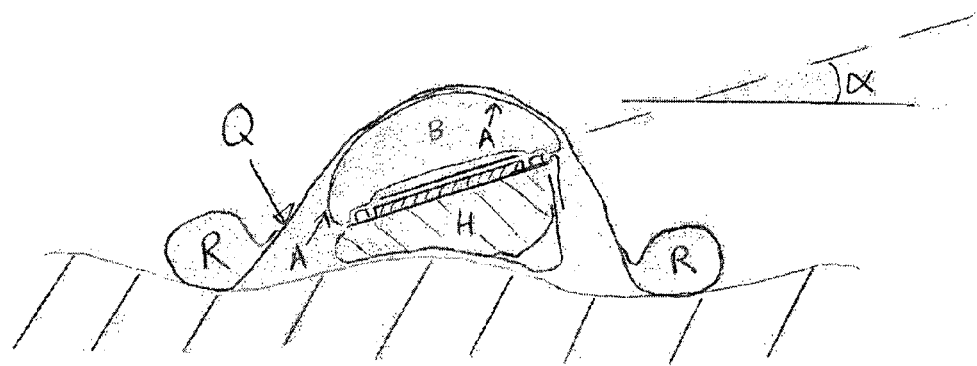
Figure 9:
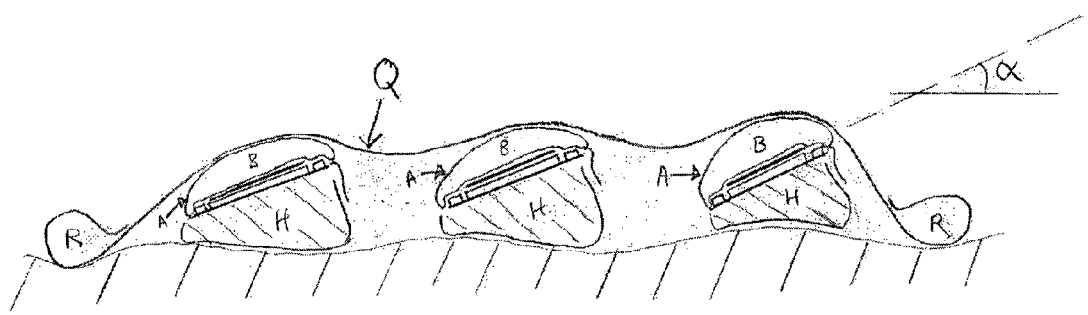

FIGS. 8 and 9 show a cross-sectional view of embodiments employing a sacrificial cover sheet (Q) which is stretched over a single PV-module (FIG. 8) or a plurality of PV-modules (FIG. 9), and secured along the edges, e.g. by a securing mass (R). The PV-modules shown in FIGS. 8 and 9 are of the type shown in FIG. 1, but may be of any of the other types falling within the scope of the present disclosure.

Figure 10:
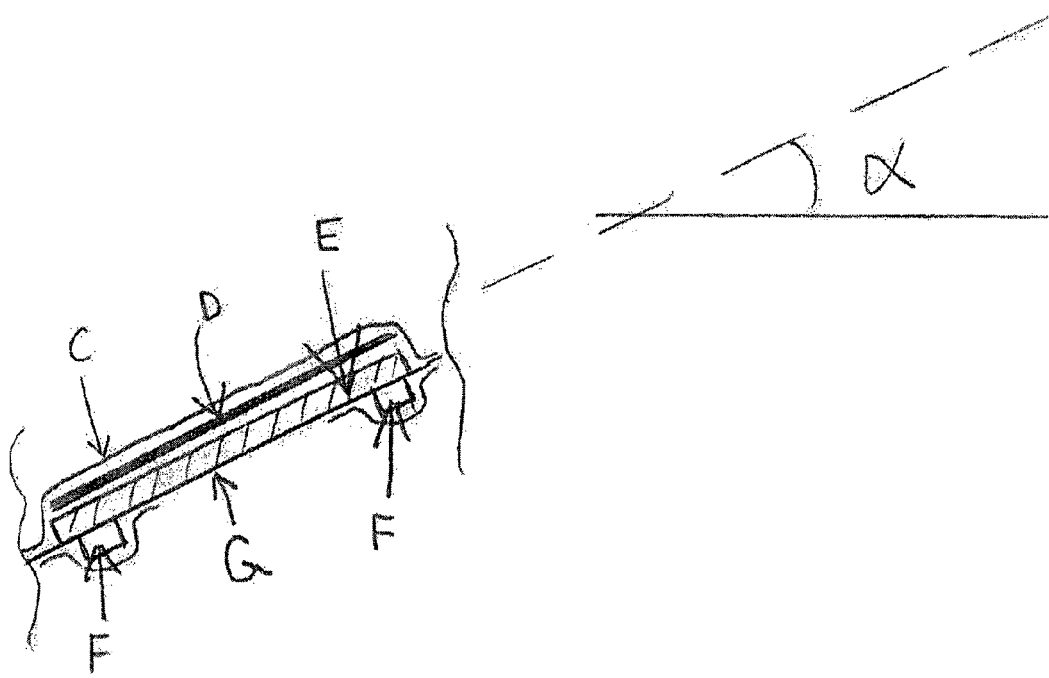

FIG. 10 shows a cross-sectional detail of the central part of a further embodiment of PV-module according to the invention, wherein return cables or other power conductors are arranged on the rear side of the support panel (G) to act as section stiffeners (F). The stiffeners (F) provide the same stiffening reinforcement and support to the PV-cells as discussed above. However, the central part can be made narrower, thereby reducing the footprint of a given PV-module.

FIG. 11 shows a cross-sectional view of a PV-module according to a further embodiment according to the invention. The PV-module comprises a top portion corresponding to that of FIG. 1. In this embodiment, the top portion is the collapsible portion. However, the bottom portion is shaped as a pre-formed tray, e.g. made from an extrusion profile. The tray has a bottom surface and upwardly projecting side walls defining an integrated ballast chamber (I) which is open at the top. The bottom portion is laid out on a supporting surface of the deployment site, and then conveniently filled with ballast material (H) from the top. The PV-module is then assembled on-site by deploying the collapsible top portion on top of the ballasted bottom portion and joining the top portion to the bottom portion at flange portions provided at the top end of the upwardly projecting side walls of the tray. Thereby the ballast chamber (I) comprising the ballasting material (H) is closed. Advantageously the flange portions are adapted so as to ensure an appropriate tilt angle $\alpha$ for the given deployment site.

FIG. 12 shows a cross-sectional view of a PV-module comprising tilt angle adjust means. The PV-module comprises a top portion with a support panel (G) carrying a string of PV-cells (D), which here by way of example is shown in the configuration of FIG. 1. The PV-module further comprises a bottom portion with an integrated ballast chamber (I) that is filled with a ballasting material (H). The bottom portion further comprises an inflatable wedge shaped chamber (O) arranged between the support panel (G) and the ballast chamber (I). The tip of the wedge forms a longitudinally oriented hinge defining the tilt axis, whereas the side faces of the wedge form the load carrying surfaces transferring the adjustment actuation forces from the bottom portion to the support panel (G). The tilt angle adjustment is actuated pneumatically by inflating/deflating the chamber (O). FIG. 12a shows the chamber (O) in a fully inflated state where the panel is at a maximum tilt angle $\alpha\_max$. FIG. 12b shows the chamber (O) in a fully deflated state where the panel is at a minimum tilt angle $\alpha\_min$.

Furthermore, the following considerations concerning the choice of materials apply. In the embodiments shown in FIGS. 1-6, 11, and 12, the protective layer is a protective top foil (A), which is the outermost protective shield of the PV-module against environmental influences. The protective top foil (A) must therefore be made from a material or a combination of materials, such as a laminate, that is stable towards weathering in general and exposure to ultraviolet radiation in particular. Suitable materials of construction for such an outermost protective top foil include FEP (Fluorinated Ethylene Propylene), ETFE (Ethylene-TetraFluoro Ethylene), PFA (PerFluoroAlkoxy), PVF (Polyinyl Fluoride, PVDF (PolyVinylidene DiFluoride) or UV stabilized variants of PC (PolyCarbonate), PMMA (Poly(Metyl Meth-Acrylate)), PET/PETG (PolyEthylene Terephetalate) or other transparent or translucent polymers.

As mentioned above with respect to FIGS. 8 and 9, it may be advantageous to draw a sacrificial foil (Q) over the entire PV-module (or a plurality of PV-modules). This sacrificial foil (Q) must be transparent or translucent in the relevant range of optical wavelengths (e.g. ~400-nm to ~1200 nm in the case of silicon), but it should also be strongly absorbing in the ultraviolet wavelength range (i.e. for wavelengths below ~390 nm) in order to protect the underlying modules from UV-induced degradation. Such a sacrificial foil also provides extra protection against other types of weathering (such as that brought about by liquid water during rain) and also protects the modules from mechanical damage from for example sand storms, birds, hail or similar environmental factors. The sacrificial foil may be locally perforated or otherwise permeable to allow water, including trapped moisture, to escape. It is expected that although a sacrificial foil will need to be replaced with regular temporal intervals due to its own weathering its usage will allow the modules to constructed out of cheaper and perhaps more environmentally benign materials. Examples for such materials are PET/PETG, PVC (PolyVinyl Chloride), PC, PMMA, HDPE (High-Density PolyEthylene), LDPE (Low-Density PolyEthylene), PLA (PolyLactic Acid) or other transparent or translucent materials as frontal layer. Finally, a sacrificial foil may itself assist in the immobilization of the underlying modules; optionally in a combination with a system of guy wires and pegs in case of particularly challenging local weather conditions.

It is also possible to metallize parts of the PV-module internally with for example aluminium (Al) or chromium (Cr) with the purpose of reflecting or concentrating light onto the PV-cells (D). This may be a particular advantage during mornings and evenings where the sun is at a low angle with respect to the horizontal plane.

A further consideration may be directed to the choice of materials for the PV-cells under economic constraints. Given that the aim of the invention is to produce photovoltaic modules which are tailored for the lowest possible production and installation costs the unit price (i.e. $/W) of the actual photovoltaic cells will be of larger relative significance than what is the case with traditional glass-plate modules. This means that the invention should become even more cost competitive by using relatively cheaper photovoltaic cells despite a slightly lower efficiency. This suggests that the use of cheap, emerging technologies such as "string-ribbon" c-Si, UMG c-Si (Upgraded Metallurgical Silicon) or thin-film cells like CdTe or CIGS/CIS could be relatively more attractive in this type of module than in traditional glass-plate modules. The important metric to maximize is power/price (i.e. W/$) —not power/area.

The PV-modules according to the present invention are designed for use in large-scale facilities and may be scaled according to different needs. For example, the length of the PV-modules may be adapted to give a certain open circuit voltage (Uoc) and operating voltage (Uop) and by making multi-string PV-modules, i.e. PV-modules containing more than one string of PV-cells, allows simultaneous control of the short circuit and operating current (Isc and Iop). The chosen voltage and current may thus be tailored to the available inverters (see Example 1 below). With practical PV-module lengths of up to 600 m a single-string PV-module may deliver Uoc voltages as high as 2500 V if industry standard 6-inch crystalline silicon cells (c-Si) are used and even higher voltages may be reached if desired by using smaller PV-cells. High working voltage (>1 kV) is generally desired in order to minimize resistive (Ohmic) losses in the cables and tabbing wire. The present industry standard voltage is 1 kV (achieved by connecting many traditional PV-modules in series), but some suppliers market PV-systems which are certified for 1.5 kV operation. One major obstacle to reaching higher operating voltages with traditional, small PV-modules is that all the many inter-panel connections must be rated for outdoor service under these same high voltages which is technically difficult, but the larger PV-modules disclosed in this invention need only have a single external connection (directly to the inverter) which makes higher operating voltages considerably easier to handle. It is also possible to make the modules of this invention with built-in inverters (micro-inverters). Such a built-in inverter may directly convert to the desired output voltage (and perhaps alternating current, AC).

EXAMPLE 1

If using industry-standard 6 inch by 6 inch c-Si PV-cells to fabricate PV-modules as described in this invention three 250 m long modules would be able to power the three (1 kV Uoc), 12 A (Isc)) inputs of a Danfoss string inverter model "Triple Lynx Pro 15 k" with more than 15 kW NOCT (Normal Operating Conditions and Temperature) —(or 17.6 kW STC (Standard Test Conditions)) which is ideal for this inverter. In this configuration the three PV-modules according to the present invention may replace a total of 72 traditional PV-modules of 220 W nominal power each. Up to 42 such inverters (thus fed by three PV-modules each) could then be coupled directly on an industry standard transformer (630 kW, 10 kV) for further connection within the PV power plant as described in the data sheet for the inverter [Danfoss Solar Inverters NS, Concept Paper, "String inverters for PV power systems" (2009)].

The invention claimed is:

1. An elongate photovoltaic (V) module for use in a solar energy conversion plant for the production of electricity from incident light, the PV-module comprising:
   a top portion with a support panel carrying on a front side a plurality of electrically connected PV cells, and a transparent protective layer sealed to the support panel so as to encapsulate the PV cells between the support panel and the protective layer,
   a collapsible portion configured to be collapsible in a longitudinal direction by folding and/or rolling, wherein the collapsible portion includes at least the top portion,
   one or more integrated ballast chambers in a bottom portion of the PV-module arranged on a rear side of the support panel, wherein said one or more integrated ballast chambers is adapted to receive an amount of a ballasting material with a weight sufficient to immobilize the PV-module on a supporting surface of a deployment site under pre-determined characteristic climate conditions for the deployment site,
   wherein the transparent protective layer is made of a flexible material, which is adapted to be distended above the support panel by inflation and/or mechanical distension means so as to form a hollow space between the support panel and the transparent protective layer, wherein the hollow space between the support panel and the transparent protective layer is filled with a protective atmosphere,
   the PV-module further comprising:
   a sensor means adapted for providing a signal output in response to the one or more parameters selected from a group of control parameters; and
   a control unit configured to receive the signal output from the sensor means and to control the protective atmosphere in response to the signal output.

2. The PV-module according to claim 1, wherein the collapsible portion also comprises the bottom portion.

3. The PV-module according to claim 1, wherein the module is configured for generating an electric power output of at least 1 kW.

4. The PV-module according to claim 1, wherein the PV-module in its deployed state is at least 30 m long and less than about 2 m wide.

5. The PV-module according to claim 1, wherein the bottom portion is configured to maintain the support panel at a predetermined angle $\alpha$ with horizontal, wherein horizontal is perpendicular to the direction of gravity, so as to orient the PV-cells towards a principal direction of incidence of light.

6. The PV-module according to claim 1, wherein the bottom portion further comprises pneumatic actuation means for adjusting a tilt angle $\alpha$.

7. The PV-module according to claim 1, wherein the PV-cells are coated with an antireflection coating and/or wherein reflective surfaces, collimating optics and/or focussing optics are provided in the vicinity of the PV-cells for directing sunlight onto the PV-cells.

8. The PV-module according to claim 1, wherein infrastructure means are provided for collecting, transferring and/or conditioning the electricity generated by the PV-cells for output to an output interface of the PV-module.

9. The PV-module according to claim 1, wherein the PV-module is covered by a separate sacrificial transparent protection sheet.

10. The PV-module according to claim 1, wherein the PV cells are silicon PV cells.

11. The TV-module according to claim 1, wherein the integrated ballast chamber of the bottom portion is further configured to be in thermal contact with the top portion.

12. The PV-module according to claim 1, wherein the collapsible portion comprises relatively stiff sections that are connected to each other in a longitudinal direction by folding zones formed by relatively flexible sections allowing the relatively stiff sections to be folded onto each other about a folding line oriented transverse to the longitudinal direction.

13. The solar power plant according to claim 12, wherein the PV cells comprise non-bendable PV cells, wherein the non-bendable PV cells are arranged on the relatively stiff sections.

14. The solar power plant according to claim 13, wherein the collapsible portion within the relatively stiff sections further comprises one or more stiffening substrate pads supporting the PV-cells, wherein the one or more substrate pads are discontinuous in a longitudinal direction, the substrate pads being interrupted at least at the folding zones.

15. A method of installing an elongated PV-module at a deployment site for use in a large-scale solar energy conversion plant for the production of electricity, wherein the PV-module comprises a top portion having a support panel carrying on a front side electrically connected non-bendable PV-cells and a transparent protective layer sealed to the support panel so as to encapsulate the PV-cells between the support panel and the protective layer, wherein the PV-module in its installed state further comprises one or more integrated ballast chambers in a bottom portion of the PV-module arranged on a rear side of the support panel, and that the method comprises the steps of:
   providing both the top portion and the bottom portion at the deployment site, wherein at least the top portion is provided at the deployment site as a lengthwise collapsible portion of the PV-module in a collapsed state, wherein the collapsible portion comprises relatively stiff sections that are connected to each other in a longitudinal direction by folding zones formed by relatively flexible sections allowing the relatively stiff sections to be folded about a folding line oriented transverse to the longitudinal direction, wherein the PV cells comprise non-bendable PV cells, wherein the non-bendable PV cells are arranged on the relatively stiff sections, and wherein the transparent protective layer is made of a flexible material, which is adapted to be distended above the support panel by inflation and/or mechanical distension means so as to form a hollow space between the support panel and the transparent protective layer;

expanding the collapsible portion at the deployment site;

filling the one or more ballast chambers through one or more openings in the bottom portion with an amount of a ballasting material having a weight sufficient to fix the PV-module to the supporting surface under pre-determined characteristic climate conditions for the deployment site; and distending the transparent protective layer above the support panel so as to form a hollow space between the transparent protective layer and the PV-cells; and maintaining a protective atmosphere within the hollow space, wherein the protective atmosphere is controlled at least with respect to humidity.

16. The method according to claim 15, wherein the collapsible portion comprises the bottom portion attached to the rear side of the support panel such that the PV module is installed by expanding the collapsible portion directly onto the support surface, and filling the ballasting material into the one or more ballast chambers.

17. The method according to claim 15, wherein the PV-module is installed by laying out the bottom portion on the support surface, loading the one or more ballast chambers, and expanding and attaching the collapsible top portion onto the bottom portion.

18. A Solar power plant comprising a plurality of PV-modules, the PV-modules comprising:

a top portion with a support panel carrying on a front side a plurality of electrically connected PV cells, and a transparent protective layer sealed to the support panel so as to encapsulate the PV cells between the support panel and the protective layer, a collapsible portion configured to be collapsible in a longitudinal direction by folding and/or rolling, wherein the collapsible portion includes at least the top portion, one or more integrated ballast chambers in a bottom portion of the PV-module arranged on a rear side of the support panel, wherein said one or more integrated ballast chambers is adapted to receive an amount of a ballasting material with a weight sufficient to immobilize the PV-module on a supporting surface of a deployment site under pre-determined characteristic climate conditions for the deployment site, wherein the collapsible portion comprises relatively stiff sections that are connected to each other in a longitudinal direction by folding zones formed by relatively flexible sections allowing the relatively stiff sections to be folded onto each other about a folding line oriented transverse to the longitudinal direction, wherein the PV cells comprise non-bendable PV cells, wherein the non-bendable PV cells are arranged on the relatively stiff sections, and wherein the transparent protective layer is made of flexible material, which is adapted to be distended above the support panel by inflation and/or mechanical distension means so as to form a hollow space between the support panel and the transparent protective layer, wherein the hollow space between the support panel and the transparent protective layer is filled with a protective atmosphere, the solar power plant further comprising:

a sensor means adapted for providing a signal output in response to one or more parameters selected from a group of control parameters including composition, pressure, humidity, flow rate, re-circulation rate, re-circulation fraction, and temperature of the protective atmosphere; and a control unit configured to receive the signal output from the sensor means and to control the protective atmosphere in response to the signal output.

19. The solar power plant according to claim 18, wherein the collapsible portion within the relatively stiff sections further comprises one or more stiffening substrate pads supporting the PV-cells, wherein the one or more substrate pads are discontinuous in a longitudinal direction, the substrate pads being interrupted at least at the folding zones.

* * * * *